United States Patent
Spencer et al.

(10) Patent No.: US 8,487,392 B2
(45) Date of Patent: Jul. 16, 2013

(54) HIGH POWER DENSITY BETAVOLTAIC BATTERY

(75) Inventors: Michael Spencer, Ithaca, NY (US); MVS Chandrashekhar, Columbia, SC (US)

(73) Assignee: Widetronix, Inc., DE (US)

(*) Notice: Subject to any disclaimer, the term of this patent is extended or adjusted under 35 U.S.C. 154(b) by 323 days.

(21) Appl. No.: 12/851,555

(22) Filed: Aug. 6, 2010

(65) Prior Publication Data

US 2011/0031572 A1 Feb. 10, 2011
US 2011/0298071 A9 Dec. 8, 2011

Related U.S. Application Data

(60) Provisional application No. 61/231,863, filed on Aug. 6, 2009, provisional application No. 61/306,541, filed on Feb. 21, 2010.

(51) Int. Cl.
*H01L 27/14* (2006.01)

(52) U.S. Cl.
USPC ........ 257/428; 438/19; 438/56; 257/E21.465; 310/303

(58) Field of Classification Search
USPC .................................. 257/429; 210/302, 303
See application file for complete search history.

(56) References Cited

U.S. PATENT DOCUMENTS

| | | | | | |
|---|---|---|---|---|---|
| 2,837,668 | A | * | 6/1958 | Simpson | 310/26 |
| 2,864,012 | A | * | 12/1958 | Thomas et al. | 310/302 |
| 2,900,535 | A | * | 8/1959 | Thomas | 310/302 |
| 3,094,634 | A | * | 6/1963 | Rappaport | 310/303 |
| 3,706,893 | A | * | 12/1972 | Olsen et al. | 310/303 |
| 5,082,505 | A | * | 1/1992 | Cota et al. | 136/253 |
| 5,087,533 | A | * | 2/1992 | Brown | 429/5 |
| 5,260,621 | A | * | 11/1993 | Little et al. | 310/303 |
| 6,238,812 | B1 | * | 5/2001 | Brown et al. | 429/5 |
| 6,479,919 | B1 | * | 11/2002 | Aselage et al. | 310/303 |
| 2009/0026879 | A1 | * | 1/2009 | Prelas | 310/303 |

* cited by examiner

*Primary Examiner* — Steven Loke
*Assistant Examiner* — David Goodwin
(74) *Attorney, Agent, or Firm* — MaxvalueIP LLC

(57) ABSTRACT

To increase total power in a betavoltaic device, it is desirable to have greater radioisotope material and/or semiconductor surface area, rather than greater radioisotope material volume. An example of this invention is a high power density betavoltaic battery. In one example of this invention, tritium is used as a fuel source. In other examples, radioisotopes, such as Nickel-63, Phosphorus-33 or promethium, may be used. The semiconductor used in this invention may include, but is not limited to, Si, GaAs, GaP, GaN, diamond, and SiC. For example (for purposes of illustration/example, only), tritium will be referenced as an exemplary fuel source, and SiC will be referenced as an exemplary semiconductor material. Other variations and examples are also discussed and given.

2 Claims, 18 Drawing Sheets

HIGH POWER DENSITY BETAVOLTAIC BATTERY

This is a Continuation of (based on) a U.S. Provisional Application Ser. No. 61/231,863, filed on 6 Aug. 2009, with the same title, assignee, and inventors.

This application also claims the benefit of an earlier filing date of prior-filed U.S. provisional application Ser. No. 61/306,541, filed on Feb. 21, 2010, with the same assignee and a common inventor, Professor Michael Spencer, with the technology related to the betavoltaic battery.

FIELD OF THE INVENTION

The field of the invention relates to semiconductor materials, devices and semiconductor device packaging, plus batteries.

BACKGROUND OF THE INVENTION

Beta-voltaic devices have very high energy density and utilize radioisotopes as a fuel source. Radioisotope emissions originate from within a few microns of a radioactive material's surface at very low levels (nW/cm2-µW/cm2), despite the high power density in the bulk of the radioactive source (mW/cc-W/cc). Several semiconductor materials, such as Si, GaAs, GaP, GaN and diamond, may be used in betavoltaic devices.

However, silicon carbide (SiC) is the material used here for the production of beta voltaic devices, due to its wide bandgap. Moreover, in addition to its radiation hardness and ability not to degrade over time at higher temperatures and in harsh environments, SiC provides low leakage currents to effectively harvest low level emission rates from the isotope. The wide availability of high quality SiC substrates and epitaxy makes SiC the most practical of all semiconductors for beta-voltaics, when performance and efficiency are considered. For example, Si provides 100 times less power conversion efficiencies than SiC. Thus, betavoltaic devices made from Si are suboptimal, due to this poor efficiency.

Semiconductor-based beta-voltaic batteries find applications in several areas such as security systems and medical implants (e.g. pacemakers). In order to increase power in these and other applications in the presence of low emission levels from radioisotopes, it is necessary to take advantage of the energy density of the device and develop device geometries and packaging which maximize the size and utilization of radioisotope surface area. This invention uses novel device configurations and packaging to maximize power in betavoltaic batteries and power output per unit volume.

Beta-Voltaic Devices

A SiC based beta voltaic radioisotope battery can produce several nanowatts (nWs) to milliwatts (mWs) of power, at 1 to 2 volts, with theoretical efficiencies in excess of 30% and measured efficiencies of 20%. Radioisotopes provide fuel for these devices and emit high energy electrons, or beta particles. The radioisotope tritium may be used. Other radioactive materials, such as Nickel-63, Phosphorus-33 and Promethium, may also be used. Utilization of beta emitters is attractive because of the short penetration distance of emitted electrons. For example, a high energy electron emitted from nickel-63 is effectively stopped by 25 microns of plastic or a layer of dead skin. Moreover, beta particles do not damage semiconductor materials and are easily shielded from sensitive electronics.

For several decades, electronics have become smaller and ubiquitous. In addition, power requirements for silicon-based electronics have been made low enough to enable the realization of nanowatt electronics, and asynchronous logic platform technologies are either projecting or exhibiting a performance of 24 pJ/instruction and 28 MIPS at 0.6V. Many medical applications can be powered with 1 to 10 microwatts (µWs) of average power. With such low power consumption requirements, a beta-voltaic battery source is able to continuously power the aforementioned electronics. Using these low power electronic elements, it is also possible to implement massive intelligent sensor networks which can monitor a large range of environments and infrastructures, or power a pacemaker or other implantable devices for over 25 years.

Silicon Carbide

SiC is a wide bandgap semiconductor, which is ideally suited for use in radioisotope batteries. The material's wide bandgap provides not only for radiation resistance in long term exposure to high energy electrons, but perhaps, more importantly, the shunt resistance of SiC diodes is high enough to allow efficient extraction of energy from a radioisotope source. Silicon (Si), the semiconductor industry workhorse, cannot realize sufficiently high open circuit voltages or power conversion efficiencies to be an optimal alternative for beta-voltaic batteries. Recent improvements in SiC substrate and epitaxial technology will enable the low dislocation and defect densities required for realization of beta-voltaic devices (including batteries) which utilize this material.

Theory of a Radiation Battery

The operation of a radiation cell is well-described by the solar cell equations. The main relationship is given by $$V_{oc} = nV_T \ln(J_{gen}/J_{ss}), \quad (1)$$

where Voc is the open circuit voltage, n the ideality factor, $V_T$ the thermal voltage=25.9 mV at T=300K, $J_{gen}$ the current generated by the radioactive source, and $J_{ss}$ is the reverse saturation current of the diode used in the cell.

Using a tritium radiation source and SiC material, as illustrative examples, the current generated in the cell can be predicted as follows. The current generated in SiC by high energy electrons emitted from tritium is given as:

$$J_{gen} = (J_\beta * E_{mean\,\beta} * (1-\eta))/E_{e-h} \quad (2)$$

where $J_{Gen}$ is the net generated electron current, $J_\beta$ the net flux of beta electrons from the radiation source (~3 nA/cm² for tritiated water), $E_{mean\,\beta}$ the mean beta electron energy generated by tritium, which is 5.5 keV, $E_{e-h}$ the mean electron-hole pair creation energy, which is 5 eV for SiC, and η which is the backscattering yield, which is (10%) for SiC.

It is worthwhile to mention that each high energy beta particle from tritium generates ~1100× (5.5 keV/5 eV) current in the cell due to this e-h pair creation energy. The expected maximum current density in SiC is ~2 µA/cm². This assumes 100% carrier collection efficiency in the absorption region. For SiC, this absorption region is ~0.5 µm. Such a predictive analysis can be carried out for any radiation source, such as Ni-63, Tritium, Phosphorus-33, Pm-147 or others (e.g. see the ref. MVS Chandrashekhar et al., Appl. Phys. Lett., 88, 033506 (2006)).

Radioisotopes

There are several candidate radioisotopes which can be inserted as a power source for beta-voltaic batteries. These radioisotopes include, but are not limited to Phosphorus-33, Ni-63, Promethium and Tritium. All of the sources share the following drawback. Although the Curie load is calculated from the total volume of the radioactive material, the amount of useable energy is limited to the number of high energy electrons which escape from the surface of the source before they can be reabsorbed. The self-absorption length of these radioisotopes is of the order of microns (ref. Everhart and Hoff, J. Appl. Phys, 42, 5837 (1971)). This means that the optimum thickness for the radioisotope source material (such as foil) is microns. Only electrons from a very thin layer of radioisotope source material are extracted. Therefore, to increase total power in a betavoltaic device, it is desirable to have greater radioisotope material and/or semiconductor surface area rather than greater radioisotope material volume.

SUMMARY OF INVENTION

An embodiment of this invention is a high power density betavoltaic battery. In one embodiment of this invention, tritium is used as a fuel source. In other embodiments, radioisotopes, such as Nickel-63, Phosphorus-33 or promethium, may be used. The semiconductor used in this invention may include, but is not limited to, Si, GaAs, GaP, GaN, diamond and SiC. For this disclosure, and for purposes of illustration/example only, tritium will be referenced as an exemplary fuel source, and SiC will be referenced as an exemplary semiconductor material.

DETAILED DESCRIPTION OF INVENTION

Figure 1A:
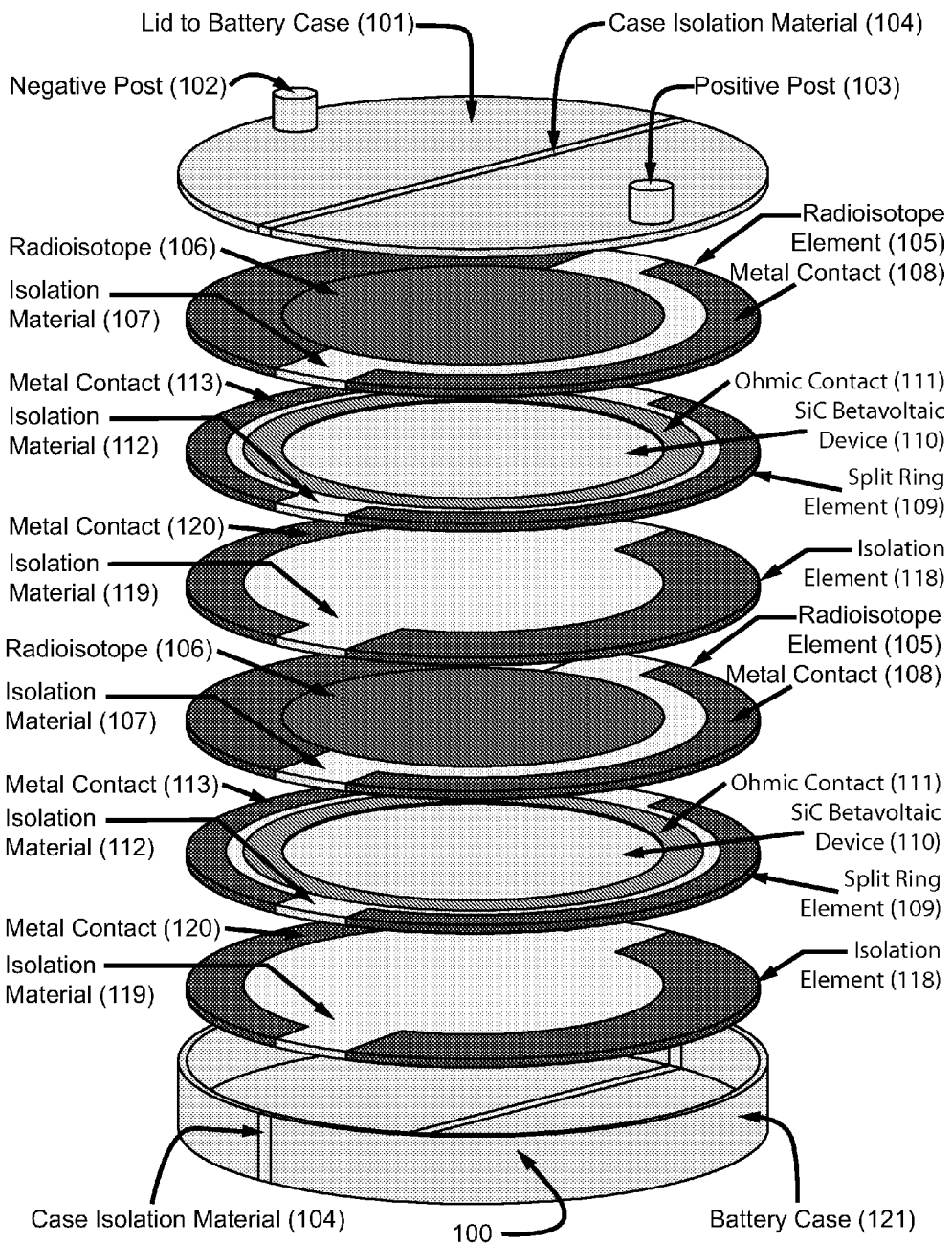
FIGS. 1 (a)-(c)—Cross-Section and Perspective Views of Betavoltaic Device w/Elements and Case (Circular Geometry, Parallel Circuit Design)
Figure 1B:
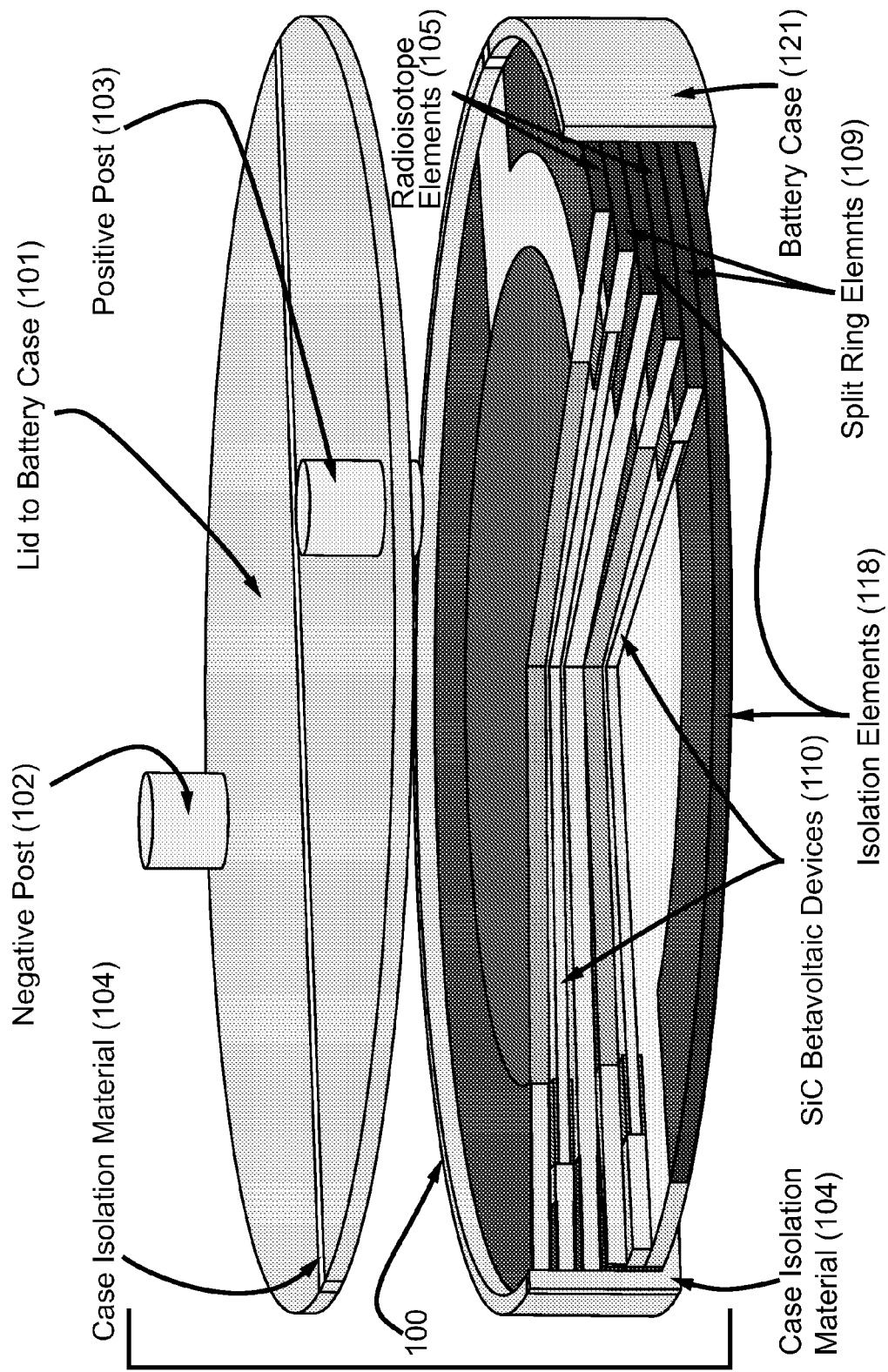
Figure 1C:
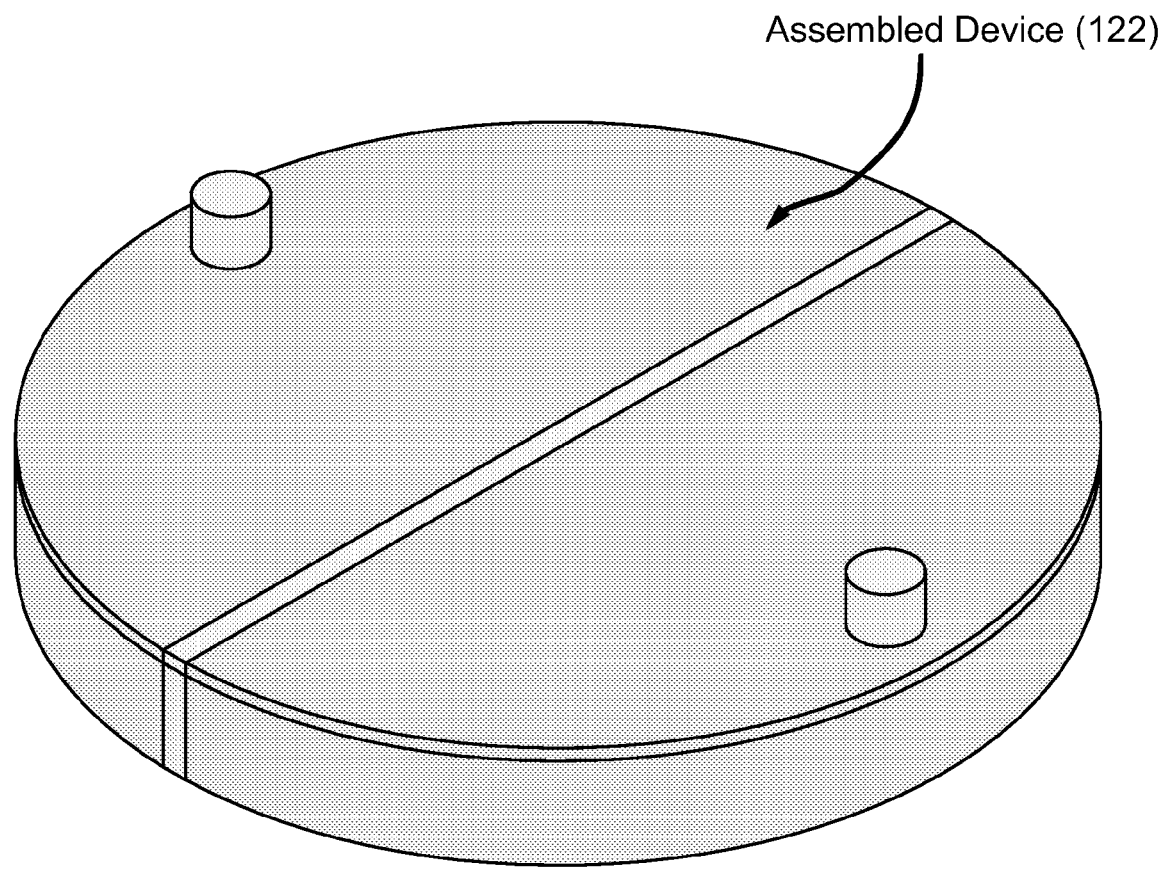
Figure 2A:
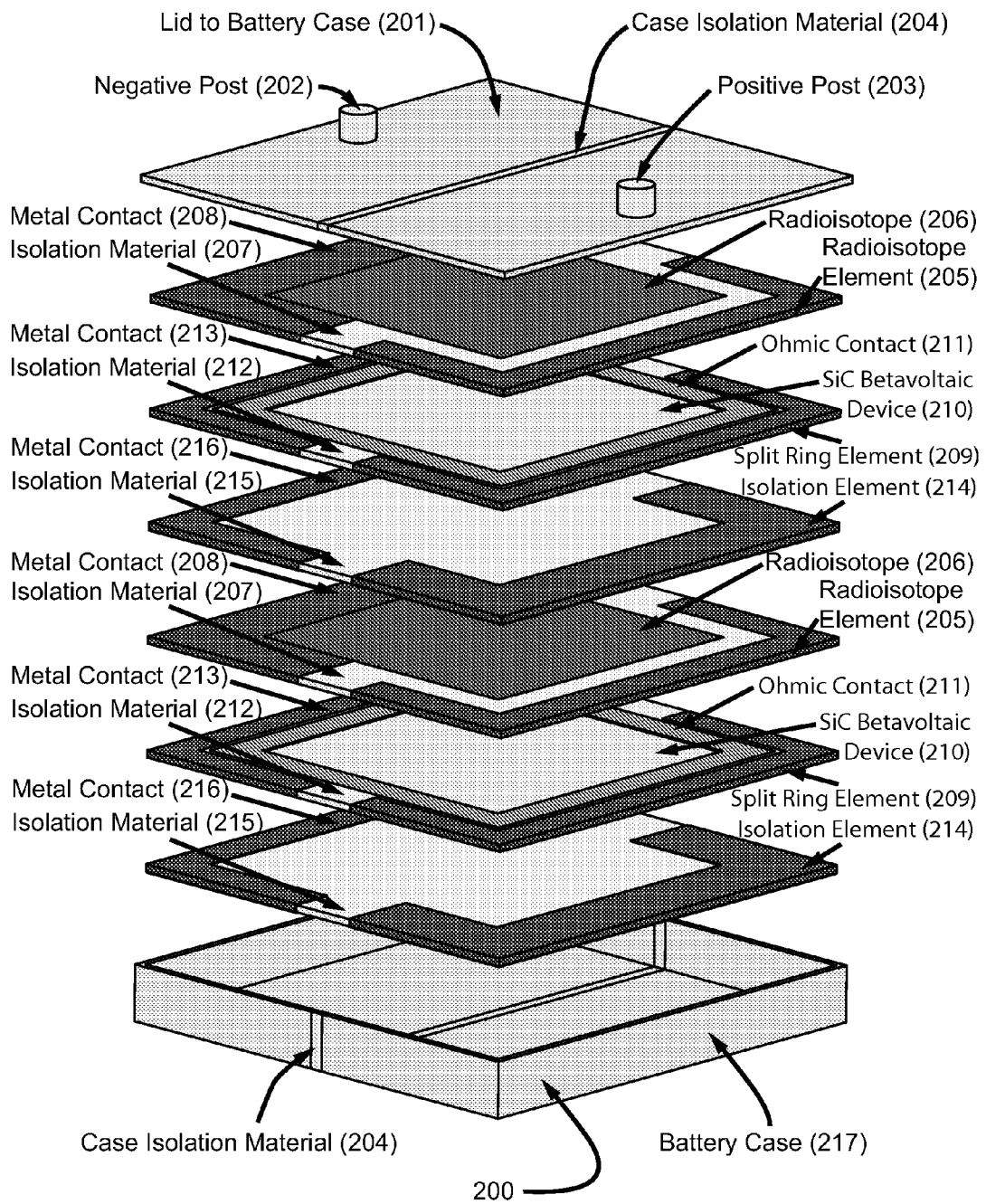
FIGS. 2 (a)-(c)—Cross-Section and Perspective Views of Betavoltaic Device w/Elements and Case (Square Geometry, Parallel Circuit Design)
Figure 2B:
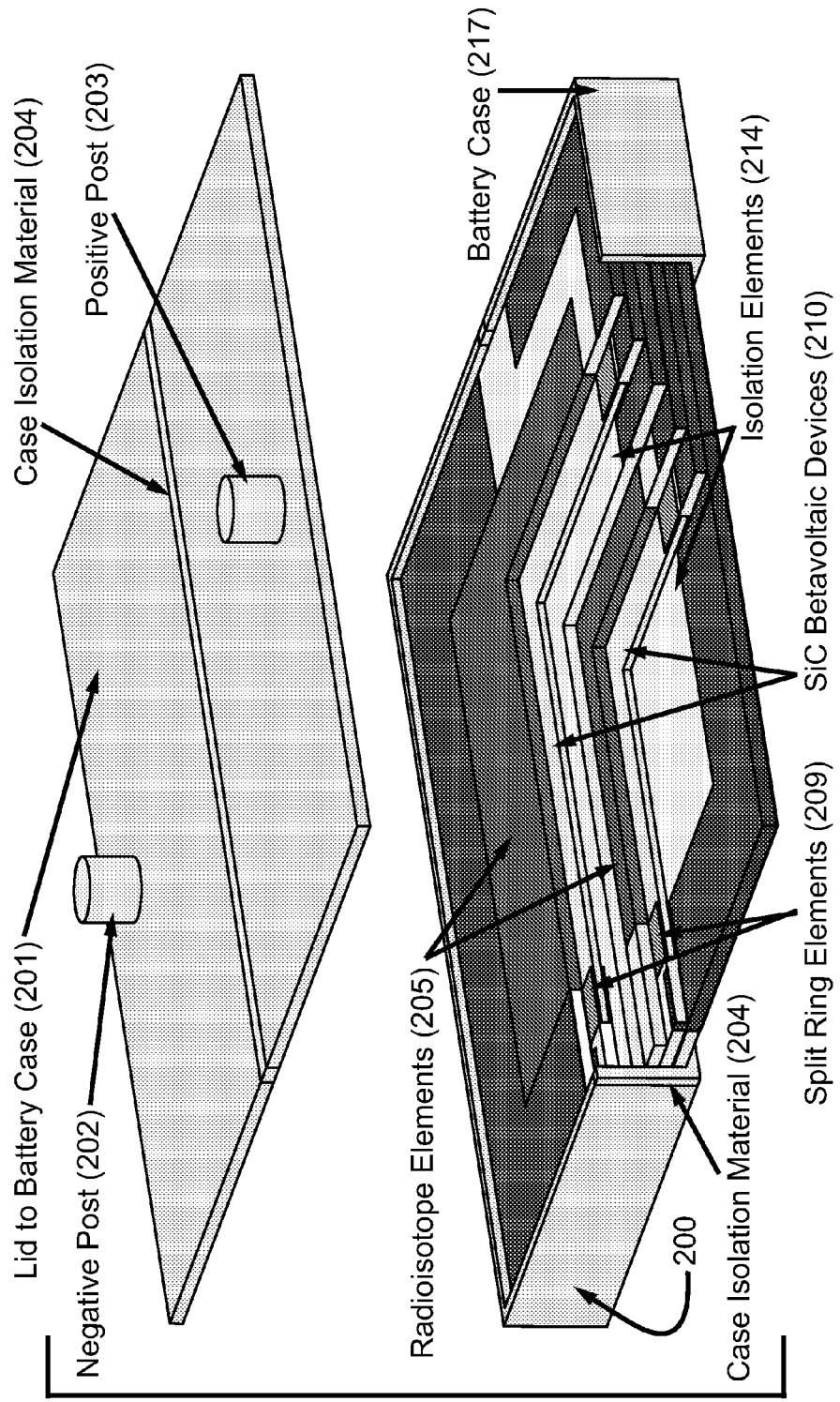
Figure 2C:
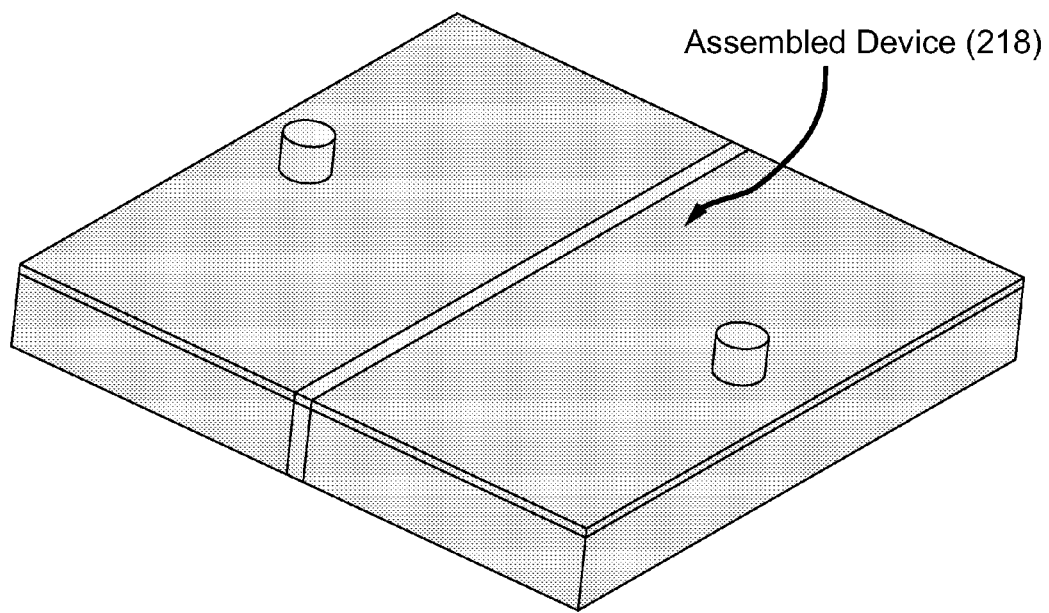
Figure 3A:
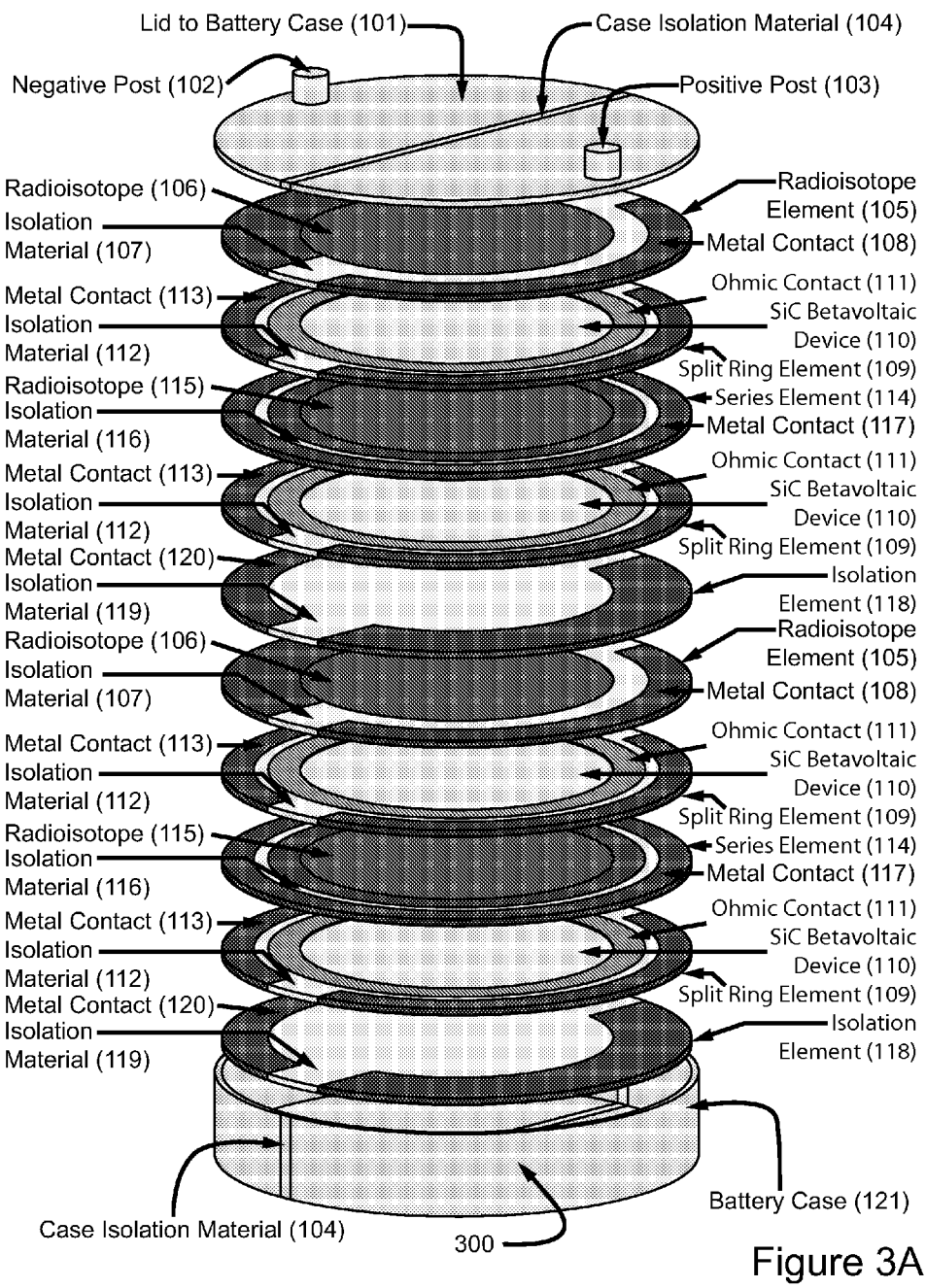
FIGS. 3 (a)-(c)—Cross-Section and Perspective Views of Betavoltaic Device w/Elements and Case (Circular Geometry, Series and Parallel Circuit Design)
Figure 3B:
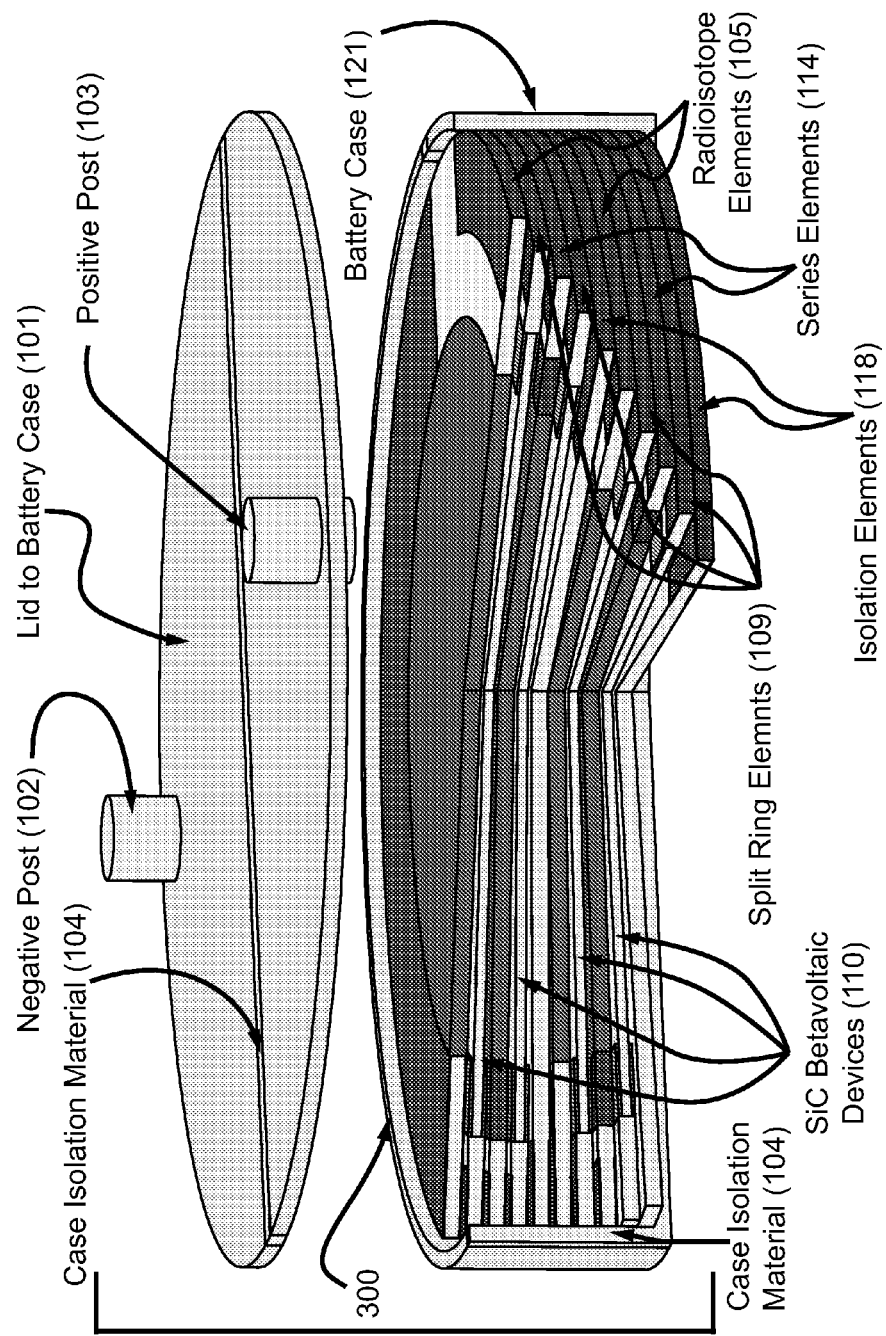
Figure 3C:
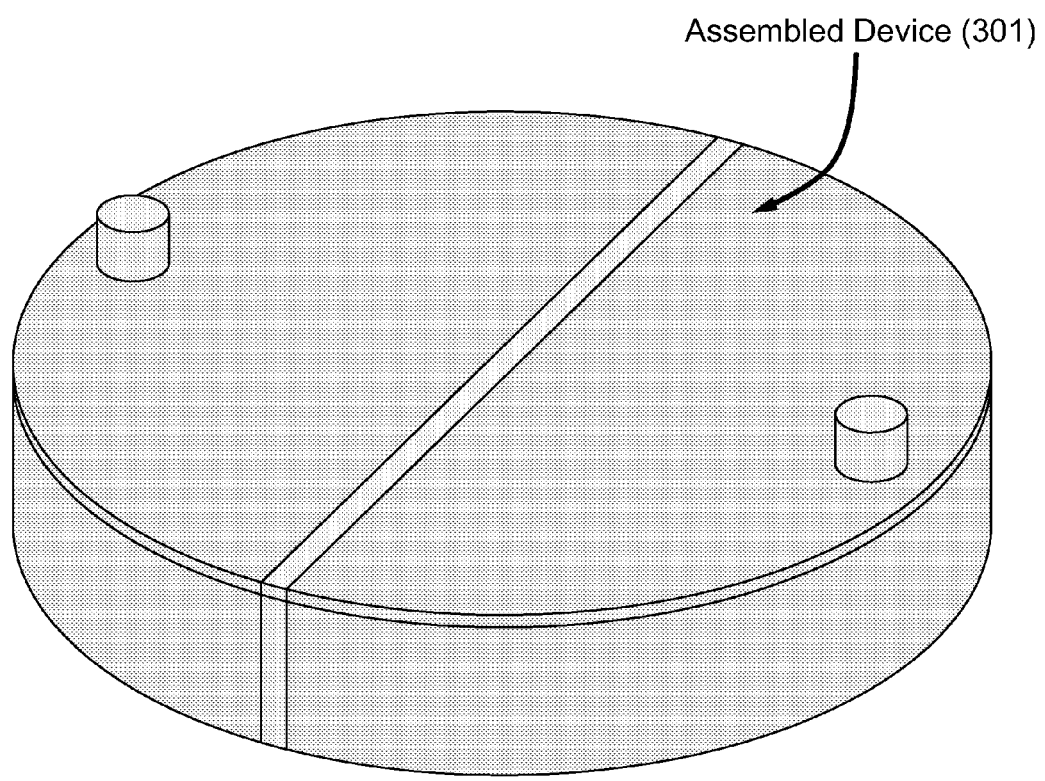

One embodiment of the invention is a circularly symmetric implementation, as shown in FIGS. 1 and 3. Square geometry, as shown in FIG. 2, may be employed, as well. Other geometries may be used to fit the application of interest.

The device is assembled one layer at a time, using various elements described below. This assembly may be performed manually or with robotic aid.

In one embodiment, the device is assembled in a case whose core is comprised of insulating material, such as aluminum oxide, and is plated with magnetic shielding material. Shielding materials, such as Fe, Ni, u (Mu)-Metal or any other material with a high magnetic susceptibility, may be used to screen stray and intentionally applied magnetic fields. The inside of the case is insulated to prevent device shorting.

In a further embodiment, the device is assembled in a case whose core is also comprised of insulating material such as aluminum oxide and is plated with electrical shielding material. Shielding materials such as Au, Ti, Fe, Ni, u (Mu)-Metal or any other material with a high electrical conductivity, may be used to screen stray and intentionally applied electrical fields. In a further embodiment, both electrical and magnetic shielding may be employed together. In a still further embodiment, a case can be made with two metal pieces fused together with an insulating material such as glass or aluminum oxide positioned between the metal pieces.

As shown in FIGS. 1, 2 and 3, cases for magnetic and/or electrical shielding comprise an isolation area in the center that is not plated with shielding material. The isolation area results in symmetric isolation between positively and negatively charged portions of the device.

Device with Parallel Circuit Design

Description of Device Elements for Parallel Circuit Design—Reference FIGS. 1 and 2: Note: references to a "top side" indicates surfaces of a device which face toward the device cap, and references to a "bottom side" indicate surfaces of a device which face away from the device cap. Moreover, when comparing the position of elements with respect to other elements, "upper" indicates a position closer to the device cap, and "lower" indicates a position farther away from the device cap.

Element 1—Split Ring Element. The element provides conduction feed-through for the package. In the drawings, region 1 or color red represents conduction regions, while region 2 or color white indicates insulating regions. This element is preferably fabricated from an insulating ceramic material, such as AlN, although other materials, such as SiO2 and sapphire, may be used. On top of this ceramic material, conduction material, such as thick gold plate, is deposited and electroplated, so as to form a low resistance path between the top and bottom of the element. A space is machined in the ceramic so as to accommodate the betavoltaic device (element 2 described below), which is inserted in the space.

Element 2—SiC Betavoltaic Device. This element generates power. Yellow color or region 3 represents the device and green color or region 4 represents ohmic contacts used in the device. Ohmic contacts are deposited on both the top and bottom sides of the device, and the device is placed in a machined space inside of split ring element 1. In placing the betavoltaic device in the split ring element, an ohmic contact is made between the bottom side of the device and one side of isolation element 4 (described below), creating a positive polarity on that side of the overall device structure. Ohmic contact is also made between the top side of the betavoltaic device and one side of radioisotope element 3 (described below), creating a negative polarity on that side of the overall device structure. Contacts made by the betavoltaic device are electrically continuous on each side of the split ring assembly. The device (a PN junction semiconductor diode) has a P and N region. In the preferred implementation, the N-region is formed by chemical vapor deposition (CVD), while the p-region is formed by ion implantation and subsequent annealing, as discussed in relevant published literature.

Element 3—Radioisotope Element. The element is a radioisotope foil (represented in grey or region 5) integrated with a conducting element, represented in red, or region 6. Insulating regions are represented in white, or region 7. In one implementation, the radioisotope is metal foil of titanium or scandium, which is irradiated by annealing in gaseous tritium. In other implementations/examples, tritium liquid may be used. Other radioisotopes mentioned herein may also be used in solid or fluid form. Insulating portions of the radioisotope element are fabricated from insulating material, such as AlN, although other materials, such as $SiO_2$ and sapphire, may be used. Conducting material shown in red, such as thick gold plate, is deposited and electroplated, so as to form a low resistance path between the top and bottom of the element.

Element 4—Isolation Element. Conducting material is shown in red, and white regions indicate insulating areas. In one implementation, the isolation element is fabricated from insulating material, such as AlN, although other materials (such as SiO$_2$ and sapphire) may be used. Conducting material shown in red, such as thick gold plate, is deposited and electroplated, thus, forming a low resistance path between the top and bottom of the element.

In one embodiment of this invention, elements 1, 2, 3 and 4 (described above) are used to create a betavoltaic device which has a parallel circuit configuration as shown in FIGS. 1 and 2. Each element is placed into a case as shown in the figures.

The split ring element 1 is placed on top of the isolating element 4. SiC device element 2 is placed inside of split ring element 1 as described above. Radioisotope element 3 is placed on top of elements 1 and 2. A lid containing positive and negative terminals is placed on the entire element stack to complete the device.

The above set of elements may be configured in a single set or repeating sets, or stacks, which are configured in parallel, until the desired power output is achieved. For the invention described above, as an example, the total output power will be approximately 0.1 µW per cm$^2$ of SiC betavoltaic device area in a set/stack, multiplied by the number of sets/stacks. In other embodiments, higher and lower output power levels in each stack may be used. FIGS. 1 and 2 show a sample device with two sets of elements. The assembly is closed with a press fit cap. This cap compresses the conductive areas and ensures a good quality contact between the layers. Although contact between elements is shown as direct contact, contact between elements may also be achieved with continuous solder or solder bumps, formed on conducting regions of each element.

Device with Series and Parallel Circuit Design

Description of Device Elements for Series and Parallel Circuit Design—Reference FIG. 3: Note: references to a "top side" indicate surfaces of a device which face toward the device cap, and references to a "bottom side" indicate surfaces of a device which face away from the device cap. Moreover, when comparing the position of elements with respect to other elements, "upper" indicates a position closer to the device cap, and "lower" indicates a position farther away from the device cap.

Element 1—Split Ring Elements. The elements provide conduction feed-through for the package. In the drawings, red represents conduction regions, while white indicates insulating regions, with regions marked and labeled above. These elements are preferably fabricated from an insulating ceramic material, such as AlN, although other materials, such as SiO2 and sapphire, may be used. On top of this ceramic material, conduction material, such as thick gold plate, is deposited and electroplated, to form a low resistance path between the top and bottom of the element. A space is machined in the ceramic so as to accommodate the betavoltaic device (element 2 described below), which is inserted in the space.

Element 2—SiC Betavoltaic Device: This element generates power. Yellow represents the device and green represents ohmic contacts used in the device. Ohmic contacts are deposited on both the top and bottom sides of the device and the device is placed in a machined space inside of split ring element 1. In placing the betavoltaic device in the split ring element, ohmic contact can be made with certain elements, based on the desired series configuration and the quantity of betavoltaic device elements utilized. Examples include:

a). qty. (quantity) two device elements 2 in series—the upper device element 2 makes ohmic contact between the top side of the device and one side of radioisotope element 3 (described below), creating a negative polarity on that side of the overall device structure. This same device also makes ohmic contact between the bottom side of the device and the top side of series element 5 (described below). The lower device element 2 makes ohmic contact between the top side of the device and bottom side of element 5. This same device element 2 makes ohmic contact between the bottom side of the device and one side of isolation element 4 (described below), creating a positive polarity on that side of the overall device structure.

b). qty. of more than two device elements in series—the configuration in a). above is used to start the series configuration, and the combination of element 5 and lower device element 2 mentioned in a) above is repeated and added to the lowermost portion of the series configuration, until the desired quantity of device elements configured in series is reached. The final lowermost device element 2 makes ohmic contact between the bottom side of the device and one side of isolation element 4 (described below), creating a positive charge on that side of the overall device structure.

The device element (a PN junction semiconductor diode) has a P and N region. In one implementation, the N-region is formed by chemical vapor deposition (CVD), while the p-region is formed by ion implantation and subsequent annealing, as discussed in relevant published literature.

Element 3—Radioisotope Element: The element is a radioisotope foil (represented in grey) integrated with a conducting element, represented in red, as shown above for different regions. Insulating regions are represented in white. In one implementation, the radioisotope is metal foil of titanium or scandium, which is irradiated by annealing in gaseous tritium. In other implementations, tritium liquid may be used. Other radioisotopes mentioned herein may also be used in solid or fluid form. Insulating portions of the radioisotope element are fabricated from insulating material, such as AlN, although other materials, such as SiO$_2$ and sapphire, may be used. Conducting material shown in red, such as thick gold plate, is deposited and electroplated, so as to form a low resistance path between the top and bottom of the element.

Element 4—Isolation Element: Conducting material is shown in red, and white regions indicate insulating areas. In one implementation, the isolation element is fabricated from insulating material such as AlN, although other materials such as SiO$_2$ and sapphire may be used. Conducting material shown in red, such as thick gold plate, is deposited and electroplated thus forming a low resistance path between the top and bottom of the element.

Element 5—Series Element: This element contains a radioisotope foil (represented in grey). The element also contains isolation material (white regions) and conductive regions, indicated in red. In one implementation, the isolation element is fabricated from insulating material such as AlN, although other materials such as SiO$_2$ and sapphire may be used. Conducting material shown in red, such as thick gold plate, is deposited and electroplated on the outermost edge of the element, thus, forming a low resistance path between the top and bottom of the element at that outer edge. Conducting material which is proximal to the radioisotope foil is not plated, but instead is formed through the entire thickness of the element as a solid conductive ring, which also provides a low resistance path between the top and bottom of the element.

In one embodiment of this invention, elements 1, 2, 3, 4 and 5 (described above) are used to create a betavoltaic device which has series and parallel circuit configurations as shown in FIG. 3. Each element is placed into a case as shown in FIG. 3.

Split ring elements 1 containing device elements 2 are placed in series, in accordance with the above, and with series element 5 placed between each element 1 and 2 combination, also in accordance with the above. The desired quantity of device elements 2 (along with split ring and series element(s) 1 and 5, respectively) are placed on top of isolating element 4. Radioisotope element 3 is placed on top of uppermost device element 2. This configuration comprises one complete set of elements. A lid containing positive and negative terminals is placed on the entire configuration to complete the device.

The above set of elements may be configured in a single set or repeating sets, or stacks, which are configured in parallel, until the desired power output is achieved. For the invention described above, the total output power will be approximately 0.1 µW per $cm^2$ of SiC betavoltaic device area in a set/stack multiplied by the number of sets/stacks.

In other embodiments, higher and lower output power levels in each set/stack may be used. FIG. 3 shows a sample device with two sets/stacks of elements. The assembly is closed with a press fit cap. This cap compresses the conductive areas and ensures a good quality contact between the layers. Although contact between elements is shown as direct contact, contact between elements may also be achieved with continuous solder or solder bumps formed on conducting regions of each element.

Figure 4A:
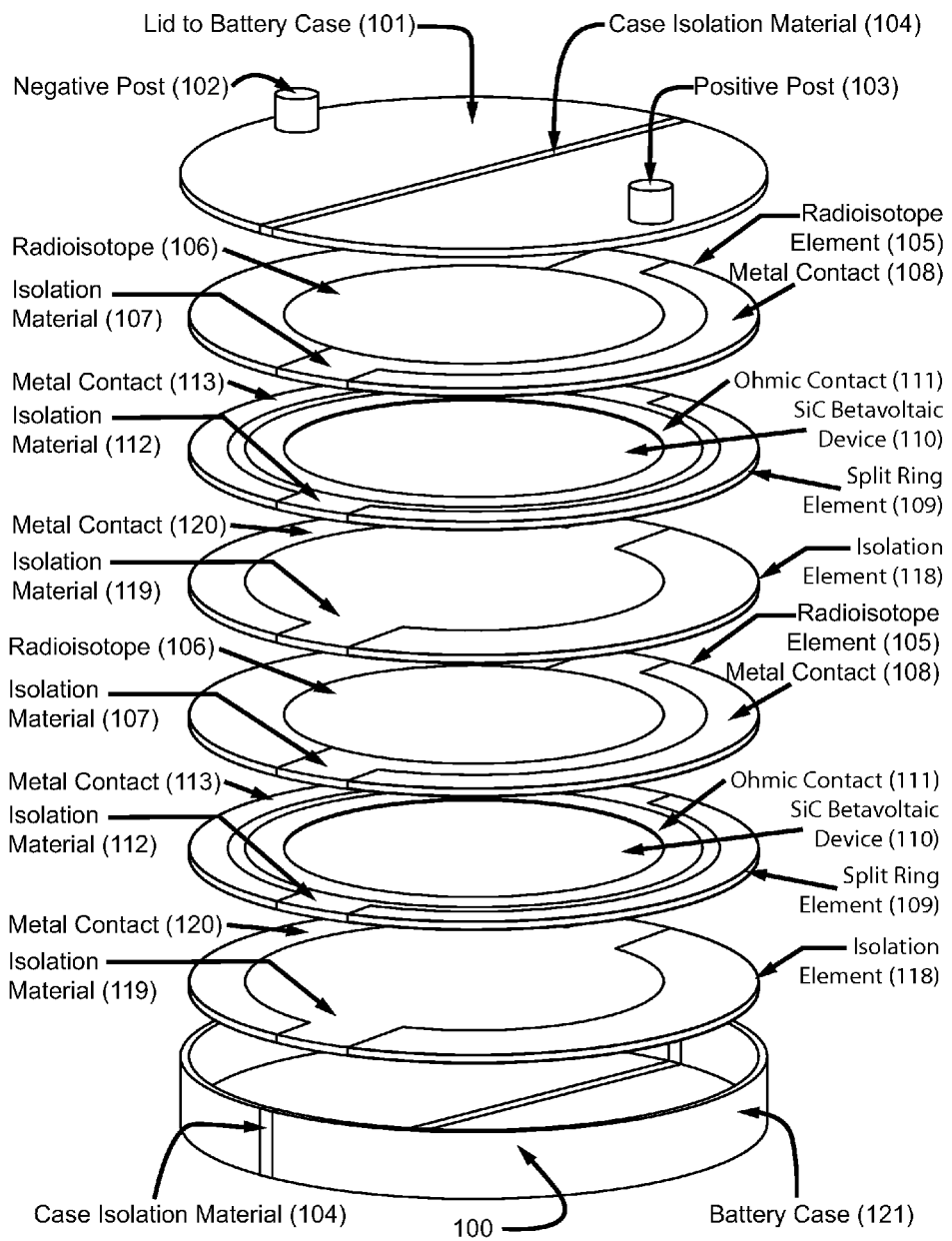
FIGS. 4 (a)-(c)—Cross-Section and Perspective Views of Betavoltaic Device w/Elements and Case (Circular Geometry, Parallel Circuit Design)
Figure 4B:
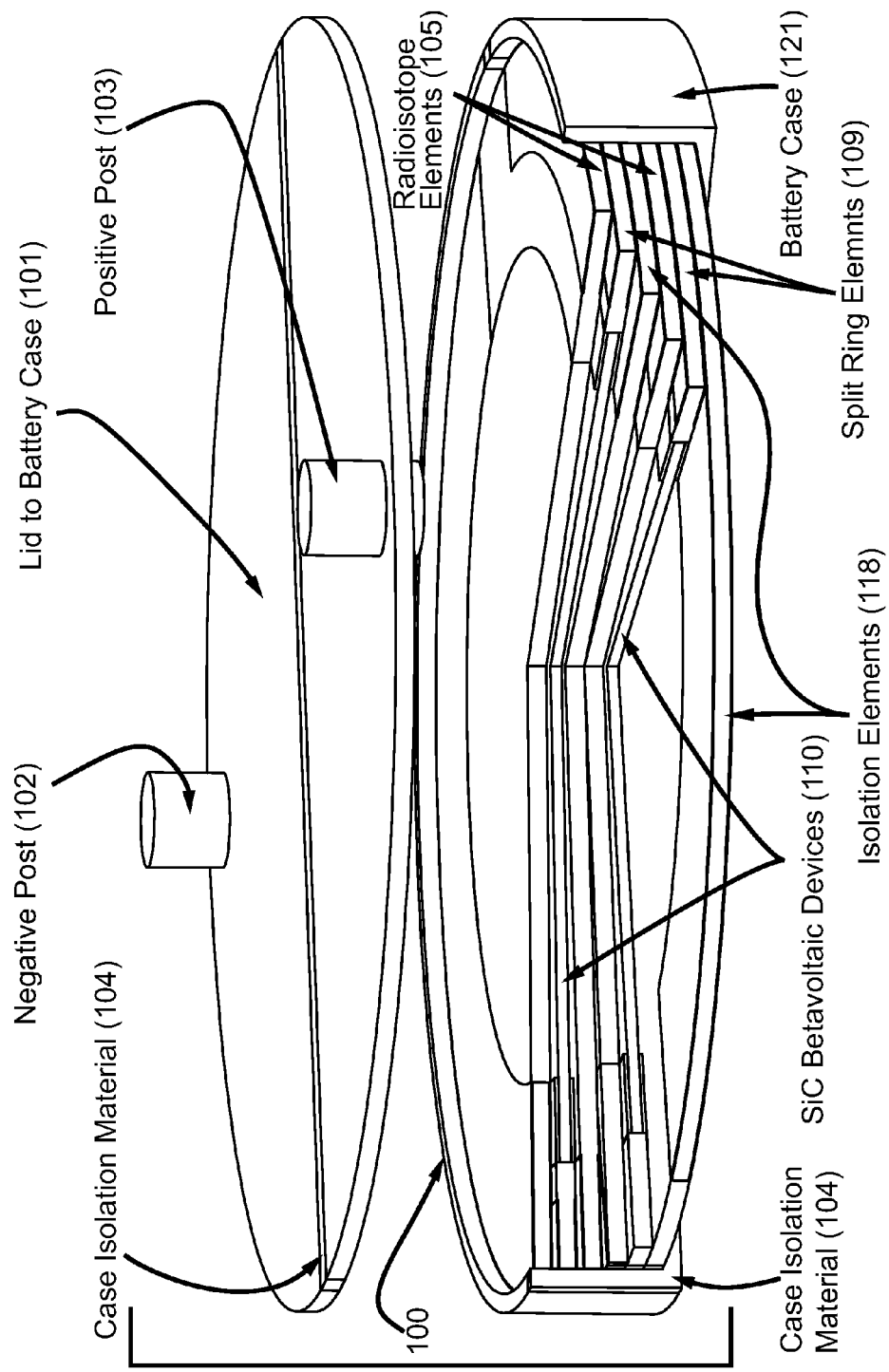
Figure 4C:
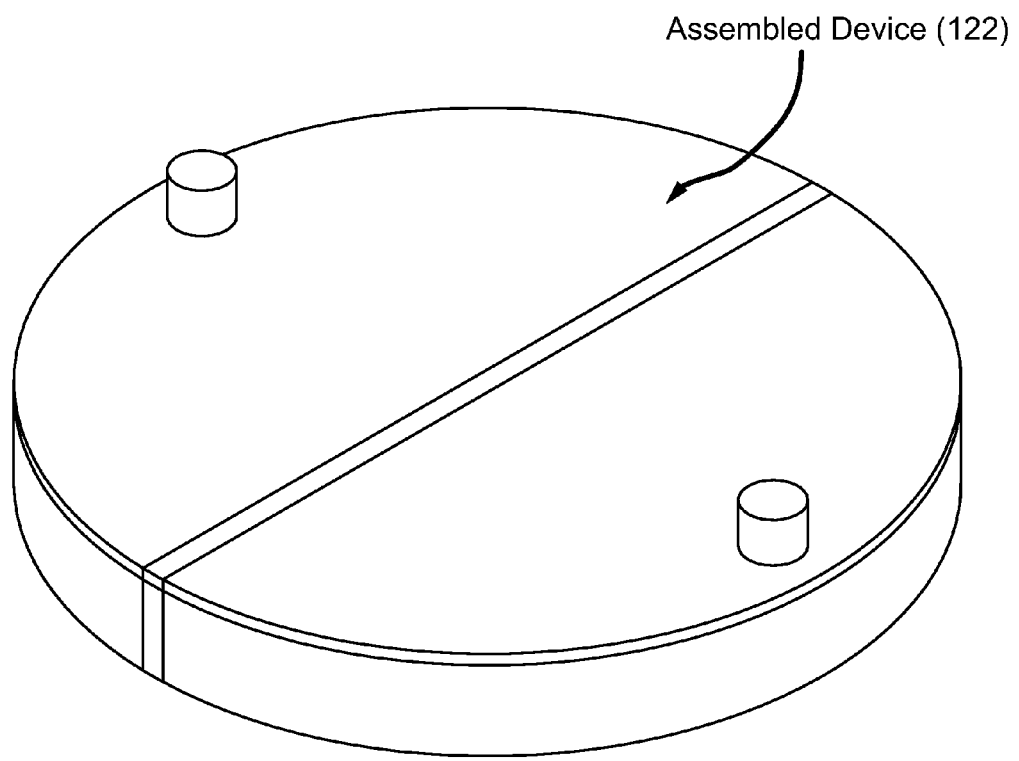
Figure 5A:
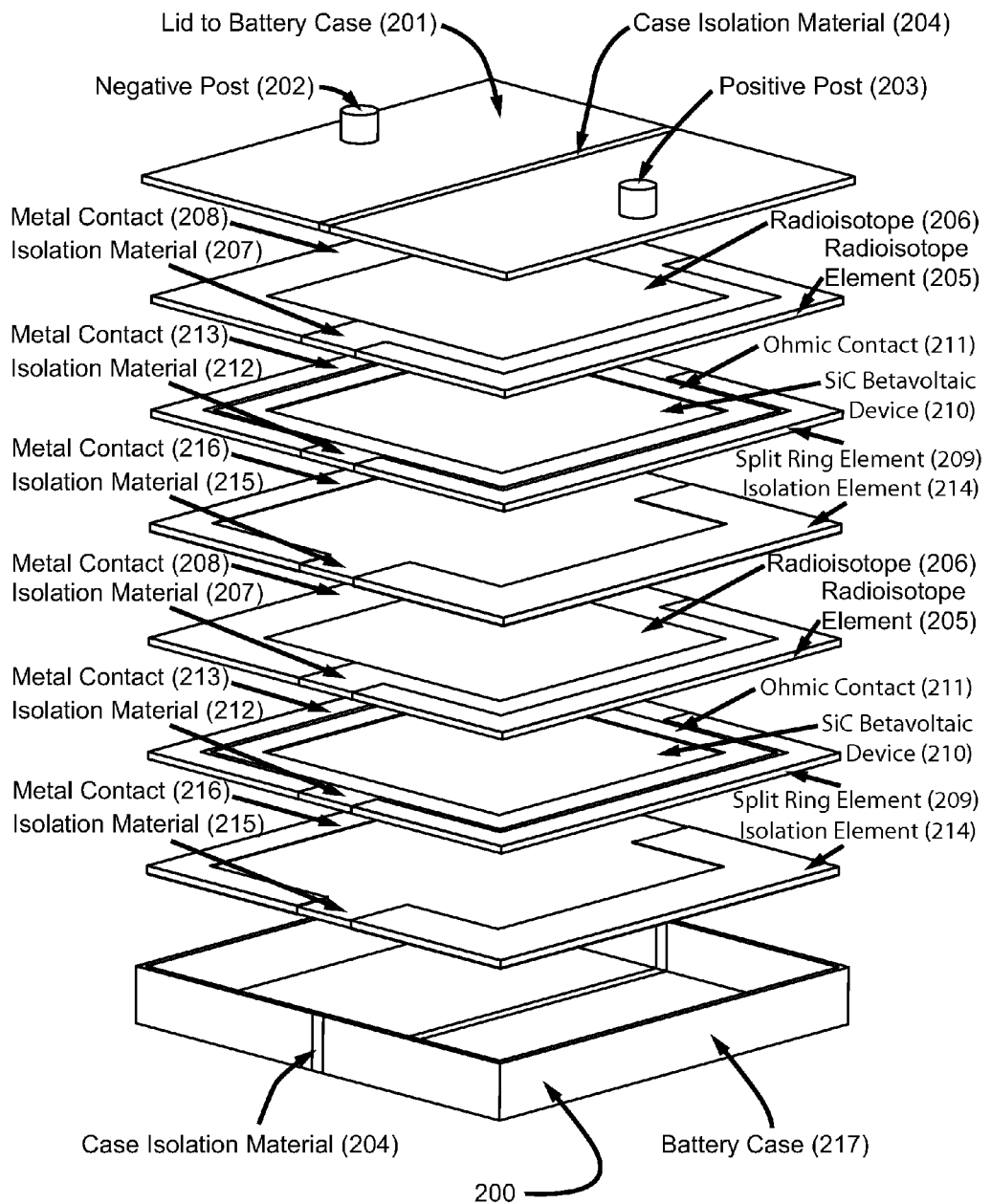
FIGS. 5 (a)-(c)—Cross-Section and Perspective Views of Betavoltaic Device w/Elements and Case (Square Geometry, Parallel Circuit Design)
Figure 5B:
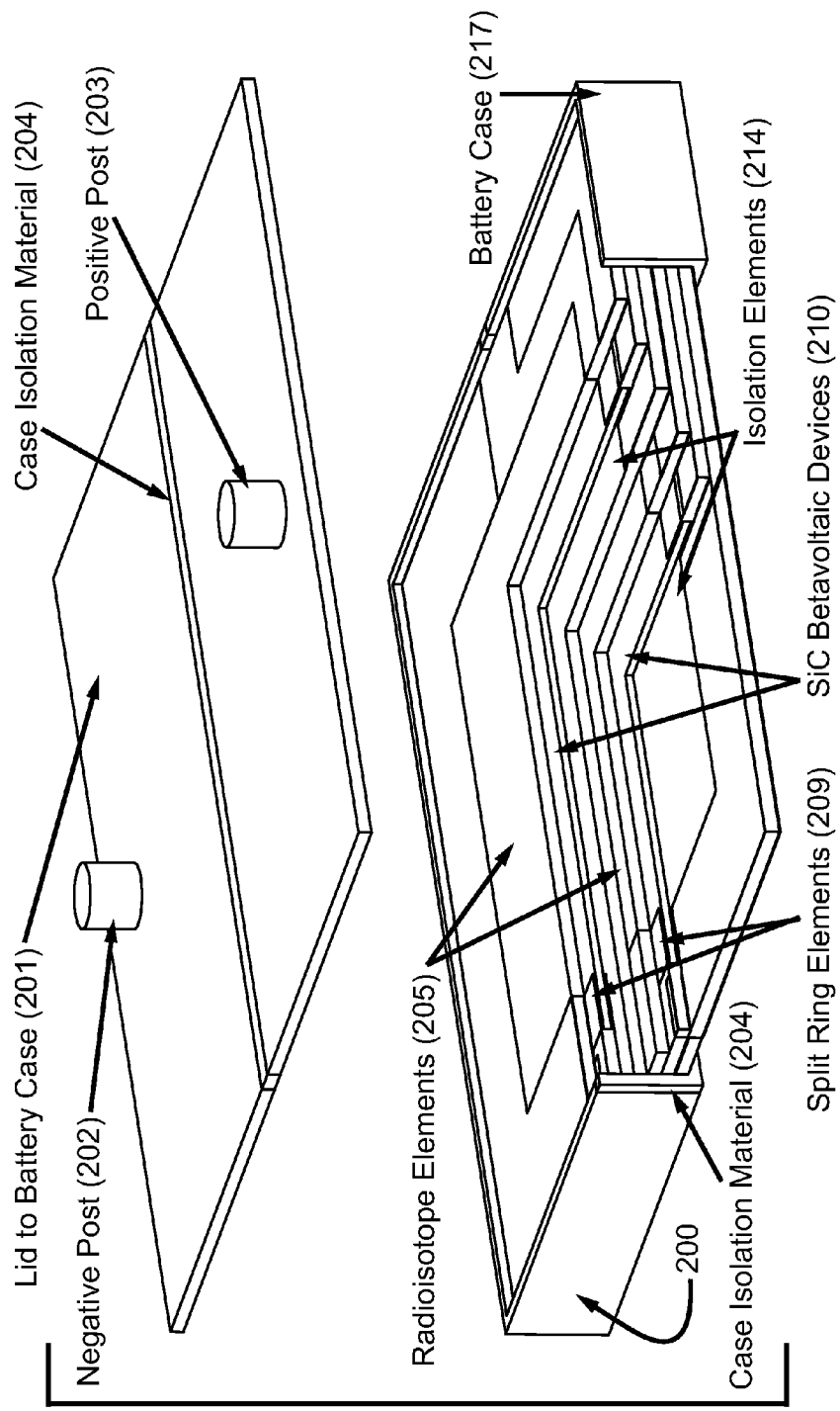
Figure 5C:
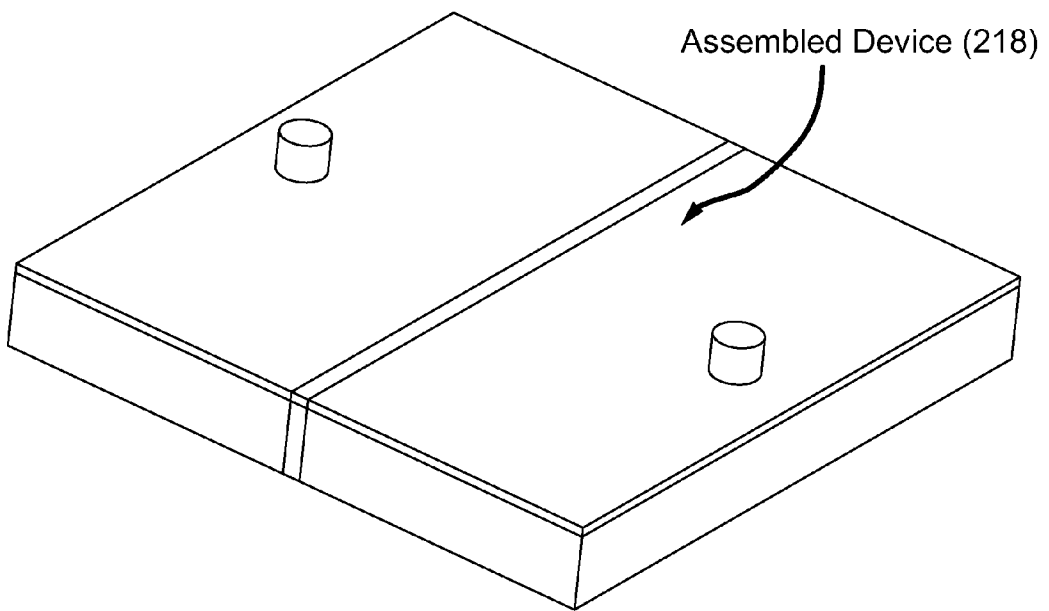
Figure 6A:
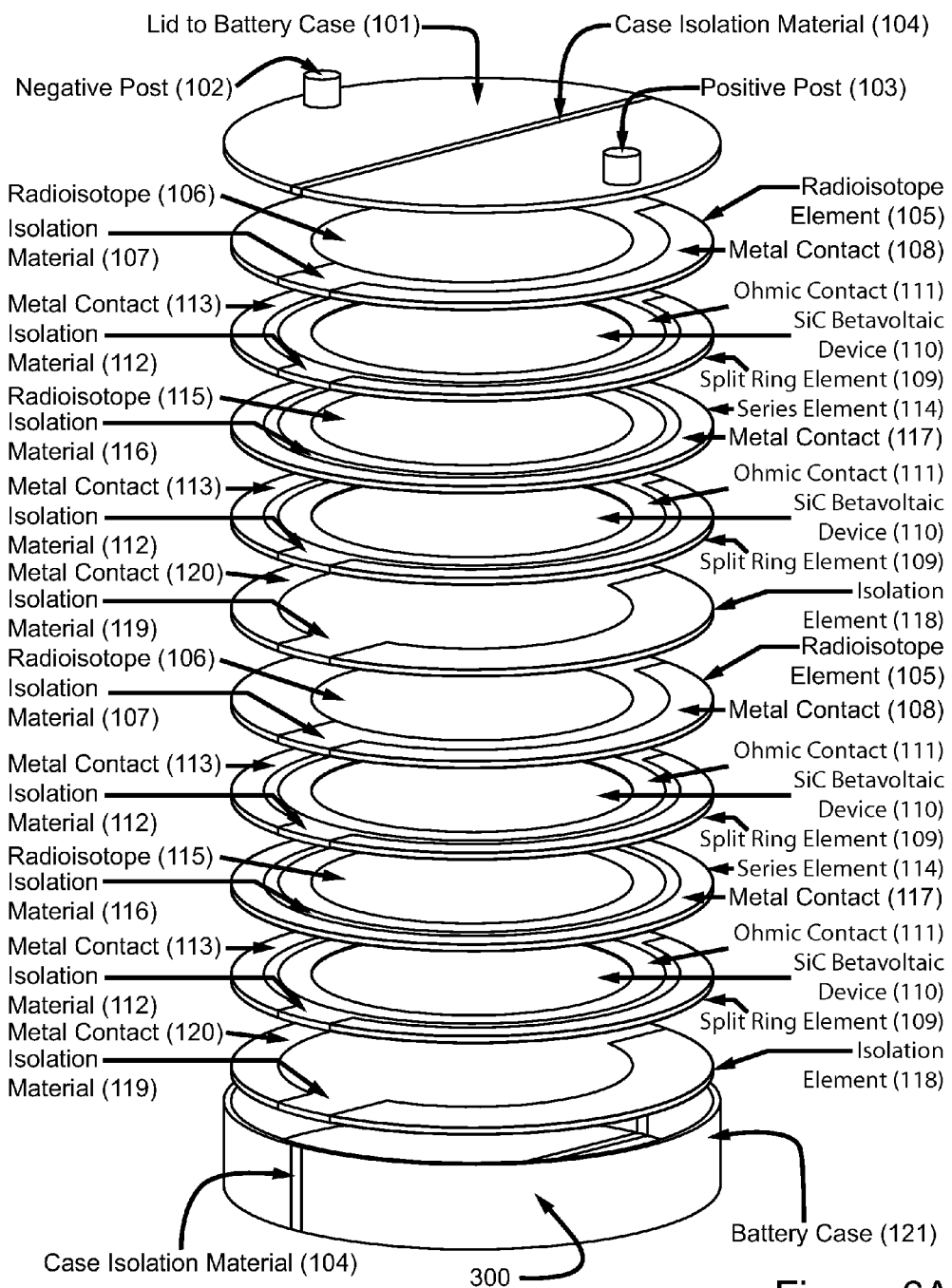
FIGS. 6 (a)-(c)—Cross-Section and Perspective Views of Betavoltaic Device w/Elements and Case (Circular Geometry, Series and Parallel Circuit Design)
Figure 6B:
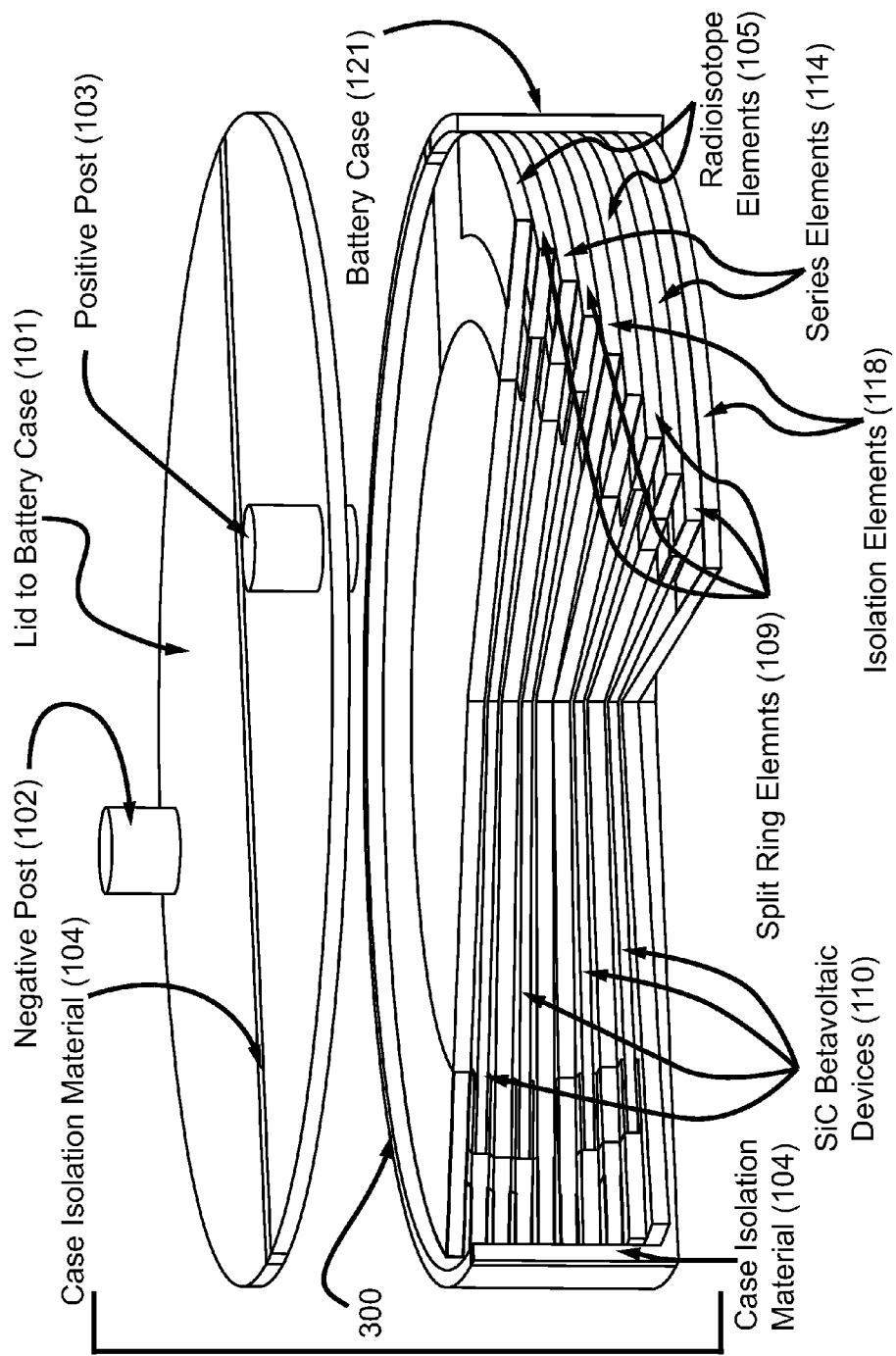
Figure 6C:
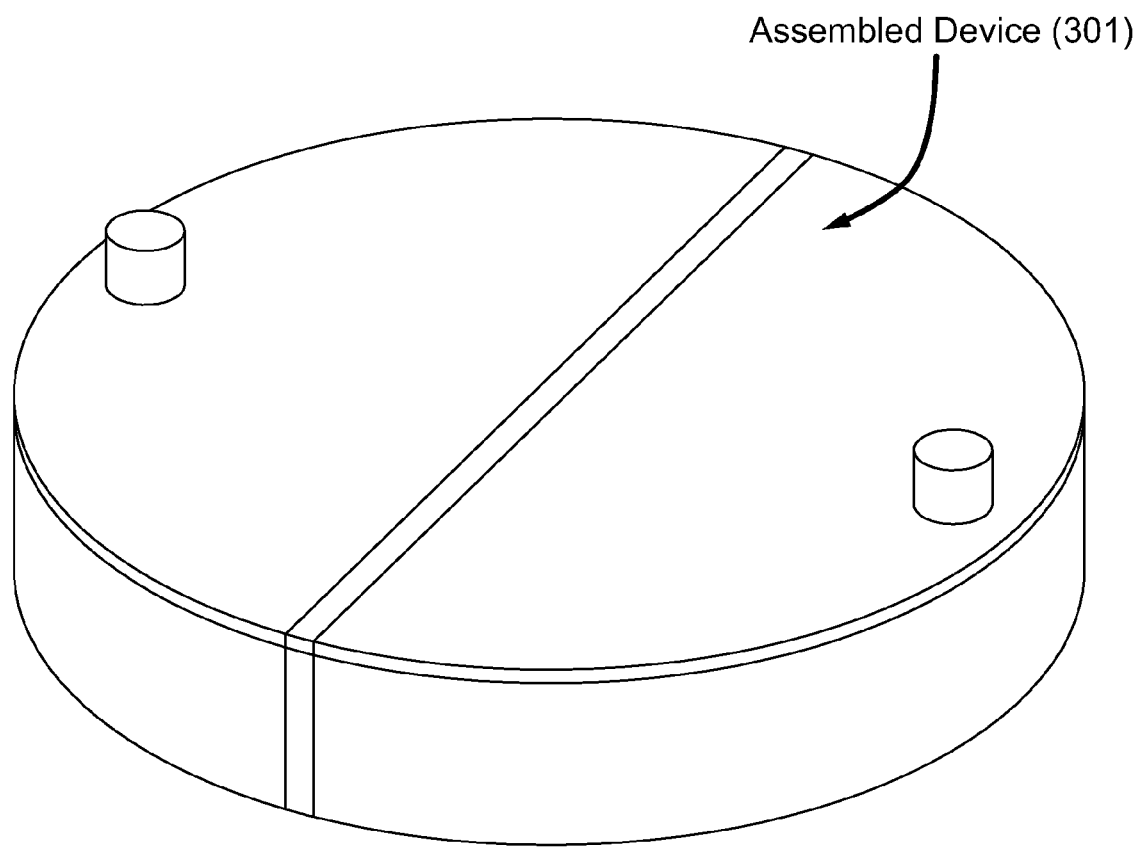

Note that FIGS. 1-3 mirror FIGS. 4-6, respectively, showing the same features in black/white drawings, versus color image, to teach the features more easily and clearly. (Different regions of the color figures are designated using colors, for the ease of teaching of the invention to the reader.)

For FIG. 1 or 4, we have the following features or parts: item 101 (Lid to Battery Case), 102 (negative post), 103 (positive post), 104 (case isolation material, or isolation material), 105 (radioisotope element, 106 (radioisotope), 107 (isolation material), 108 (metal contact), 109 (split ring element), 110 (SiC Betavoltaic device), 111 (ohmic contact), 112 (isolation material), 113 (metal contact), 118 (isolation element), 119 (isolation material), 120 (metal contact), 121 (battery case), and 122 (assembled device).

For FIG. 2 or 5, we have the following features or parts: item 201 (Lid to Battery Case), 202 (negative post), 203 (positive post), 204 (case isolation material, or isolation material), 205 (radioisotope element, 206 (radioisotope), 207 (isolation material), 208 (metal contact), 209 (split ring element), 210 (SiC Betavoltaic device), 211 (ohmic contact), 212 (isolation material), 213 (metal contact), 214 (isolation element), 215 (isolation material), 216 (metal contact), 217 (battery case), and 218 (assembled device).

For FIG. 3 or 6, we have the following features or parts: item 101 (Lid to Battery Case), 102 (negative post), 103 (positive post), 104 (case isolation material, or isolation material), 105 (radioisotope element, 106 (radioisotope), 107 (isolation material), 108 (metal contact), 109 (split ring element), 110 (SiC Betavoltaic device), 111 (ohmic contact), 112 (isolation material), 113 (metal contact), 114 (series element, or element), 115 (radioisotope), 116 (isolation material), 117 (metal contact), 118 (isolation element), 119 (isolation material), 120 (metal contact), 121 (battery case), and 301 (assembled device).

The devices can be grown on different materials or substrates, or implanted/annealed, or by any other deposition methods. They can be stacked on top of each other in series or side-by-side in parallel. The contacts may be by pressure, or no-pressure, surface adhesion, or by removal of the layer and its placement on a second substrate, or by flip-chip-type technology, reversing the orientation or direction.

The supplied material may be in shape of liquid, fluid, gas, powder, conventional semiconductor, polycrystalline, crystalline, amorphous, or combination of different crystalline regions.

The thickness of the active region can be non-uniform, or ramped thickness, variable thickness, so that different absorption or current is obtained.

The regions on the surface can be patterned so that for heat dissipation and transfer is done more efficiently, to reduce overheating, or increasing efficiency, if that effect is desired, to some optimum temperature.

The battery can be integrated on the same substrate, on same circuit, to save energy, cost, space, efficiency, or time, and increase speed.

Any other variations of the above are also meant to be included in the coverage or scope of this invention.

The invention claimed is:

1. A betavoltaic battery device, comprising:
a lid to battery case;
wherein said lid comprises a positive post, a negative post, and a case isolation strip;
wherein said case isolation strip is located between said positive post and said negative post;
a first layer;
wherein said lid is located on top of said first layer;
said first layer comprises a central isotope layer, a first isolation strip, a first metal contact strip, and a second metal contact strip;
said central isotope layer is encircled partially by said first isolation strip and said first metal contact strip;
said first isolation strip is encircled partially by said second metal contact strip;
said first isolation strip is located between said second metal contact strip and said first metal contact strip;
a second layer;
said first layer is located on top of said second layer;
said second layer comprises a central SiC betavoltaic layer, an ohmic contact strip, a second isolation strip, a third metal contact strip, and a fourth metal contact strip;
said central SiC betavoltaic layer is encircled by said ohmic contact strip;
said ohmic contact strip is encircled by said second isolation strip;
said second isolation strip is encircled partially by said third metal contact strip, and said fourth metal contact strip;
a third layer;
said second layer is located on top of said third layer;
said third layer comprises a third isolation strip, a fifth metal contact strip, and a sixth metal contact strip; and
said third isolation strip is encircled partially by said fifth metal contact strip and said sixth metal contact strip.

2. The betavoltaic battery device as recited in claim 1, wherein said central isotope layer comprises one or more of following: radioisotope tritium, Nickel-63, Phosphorus-33, or Promethium.

* * * * *